United States Patent [19]

Tsuzuki

[11] Patent Number: 4,599,631
[45] Date of Patent: Jul. 8, 1986

[54] SEMICONDUCTOR APPARATUS HAVING A ZENER DIODE INTEGRAL WITH A RESISTOR-TRANSISTOR COMBINATION

[75] Inventor: Mitsuo Tsuzuki, Yokohama, Japan

[73] Assignee: Tokyo Shibaura Denki Kabushiki Kaisha, Japan

[21] Appl. No.: 539,138

[22] Filed: Oct. 5, 1983

[30] Foreign Application Priority Data

Oct. 12, 1982 [JP] Japan .................. 57-178807

[51] Int. Cl.$^4$ ........................... H01L 29/90
[52] U.S. Cl. ..................... 357/13; 357/20; 357/34; 357/51; 357/86
[58] Field of Search ............ 357/13, 20, 51, 34, 357/86

[56] References Cited

U.S. PATENT DOCUMENTS

| | | | |
|---|---|---|---|
| 4,080,616 | 3/1978 | Horie | 357/13 |
| 4,100,561 | 7/1978 | Ollendorf | 357/13 |
| 4,258,311 | 3/1981 | Tokuda et al. | 357/13 |
| 4,267,557 | 5/1981 | Muramoto et al. | 357/13 |
| 4,451,839 | 5/1984 | Nelson | 357/86 |

FOREIGN PATENT DOCUMENTS

| | | | |
|---|---|---|---|
| 2028632 | 9/1984 | Fed. Rep. of Germany . | |
| 55-71075 | 5/1980 | Japan | 357/13 LM |

Primary Examiner—Joseph E. Clawson, Jr.
Attorney, Agent, or Firm—Finnegan, Henderson, Farabow, Garrett & Dunner

[57] ABSTRACT

A semiconductor apparatus includes a p$^+$-type region formed in the surface area of an n$^-$-type semiconductor layer formed on a p-type semiconductor substrate, and an n$^+$-type region which is formed in a contact relationship with respect to the p$^+$-type region and forms a Zener diode in conjunction with the p$^+$-type region. A p-type region is further formed in the surface area of the semiconductor layer and is electrically connected to the n$^+$-type region by a contact layer. The n$^+$-type region forms a resistor between the contact layer and the p$^+$-type region. The p-type region, semiconductor layer and substrate constitute a pnp transistor.

9 Claims, 13 Drawing Figures

F I G. 3A
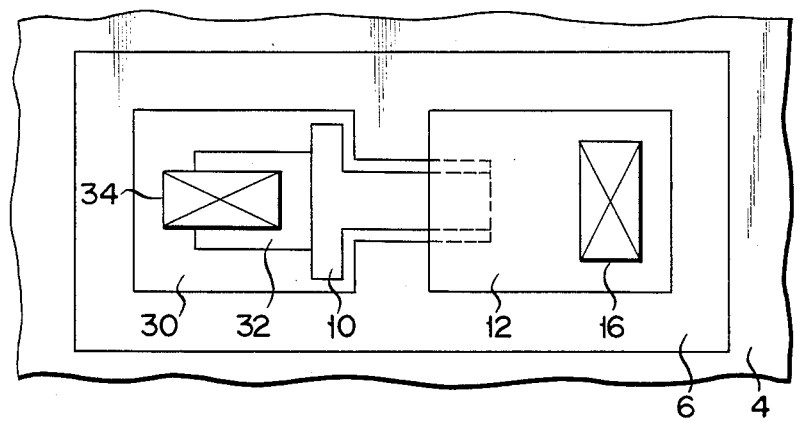
F I G. 3B
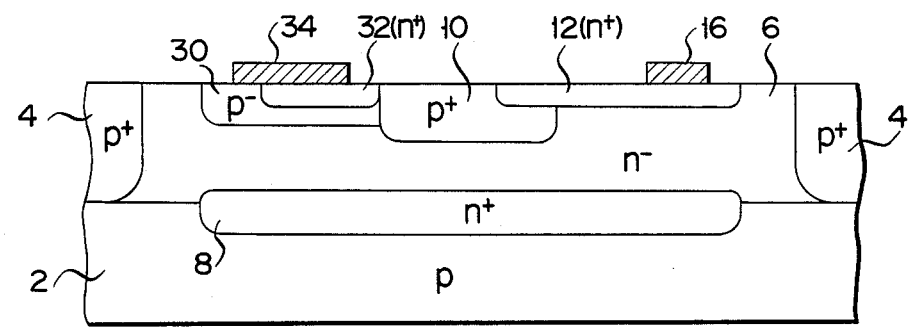
F I G. 3C
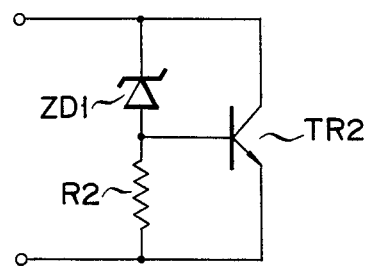

SEMICONDUCTOR APPARATUS HAVING A ZENER DIODE INTEGRAL WITH A RESISTOR-TRANSISTOR COMBINATION

BACKGROUND OF THE INVENTION

This invention relates to a semiconductor apparatus having at least a Zener diode.

It is generally known to constitute a Zener diode by forming two semiconductor regions of different conductivity types in contact with each other within a semiconductor layer. FIGS. 1A and 1B illustrate a plan pattern and a cross-sectional structure of a prior art semiconductor apparatus having a Zener diode of this kind. This semiconductor apparatus includes a p-type silicon substrate 2, a p+-type isolated region 4 which serves to form an n⁻-type island region 6 by isolating part of an n⁻-type epitaxial layer formed on the substrate 2 from other regions, an n+-type buried layer 8 formed in the boundary region between the island region 6 and the substrate 2, a p+-type anode region 10 formed in the surface area of the island region 6, and an n+-type cathode region 12 formed in the surface areas of the island region 6 and anode region 10. Anode and cathode contact layers 14 and 16 are so formed as to come into electrical contact with the anode and cathode regions 10 and 12.

In this semiconductor apparatus, the pn junction area between the anode region 10 and the cathode region 12 forms a Zener diode. When a positive surge voltage is applied to the cathode contact layer 16, a fairly large surge current flows therefrom to the anode contact layer 14. In this case, since almost all of this surge current flows through the pn junction area between the anode and cathode regions 10 and 12, there is a considerable possibility such that the pn junction will be destroyed. Therefore, conventionally, the area of the pn junction between the anode and cathode regions 10 and 12 is enlarged, or a resistor is connected in series to this Zener diode in order to increase the withstanding surge voltage of the Zener diode. However, in the ordinary operational mode, an increase in the area of the pn junction causes the density of the signal current passing through the pn junction to be reduced, so that the influence of Zener noise is not negligible. On the other hand, the connection of a resistor to the Zener diode causes the operating resistance of the Zener diode to be increased, so that although the signal will be attenuated the operational characteristics of the Zener diode are deteriorated.

SUMMARY OF THE INVENTION

It is an object of the present invention to provide a semiconductor apparatus having at least one Zener diode which improves the withstanding surge voltage characteristics without affecting the Zener characteristic.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor apparatus of this invention comprises a semiconductor substrate of one conductivity type, a semiconductor layer of an opposite conductivity type formed on the semiconductor substrate, a first and second semiconductor region of said one conductivity type separately formed in the surface area of the semiconductor layer, apart from each other, a third semiconductor region of the opposite conductivity type which is formed in the surface area of said semiconductor layer and has a higher impurity concentration than said semiconductor layer, said third semiconductor region being formed in a contact relationship with respect to said first semiconductor region, a Zener diode being formed in the junction between said first and third semiconductor regions; and connecting means for electrically connecting said second and third semiconductor regions; wherein said second semiconductor region, semiconductor layer and semiconductor substrate constitute a transistor and that portion of said third semiconductor region which lies between said connecting means and said first semiconductor region acts as a resistor.

In this invention, a resistor is connected in series to the Zener diode, and a transistor having a base and an emitter connected to both ends of this resistor is formed. When a surge current larger than a predetermined amount flows through the resistor and Zener diode, the transistor is turned on, due to the voltage drop across the resistor, and part of this surge current flows through the transistor, thereby preventing a large amount of surge current from flowing through the Zener diode.

The accompanying drawings, which are incorporated in and constitute a part of this specification, illustrate embodiments of the invention and, together with the description, serve to explain the principles of the invention.

BRIEF DESCRIPTION OF THE DRAWINGS

FIGS. 3A and 3B illustrate a plan pattern and a cross-sectional structure of a semiconductor apparatus having a Zener diode constructed according to another embodiment of this invention;

FIG. 3C is an equivalent circuit diagram of the semiconductor apparatus shown in FIGS. 3A and 3B;

DETAILED DESCRIPTION OF THE PREFERRED EMBODIMENTS

Figure 1A:
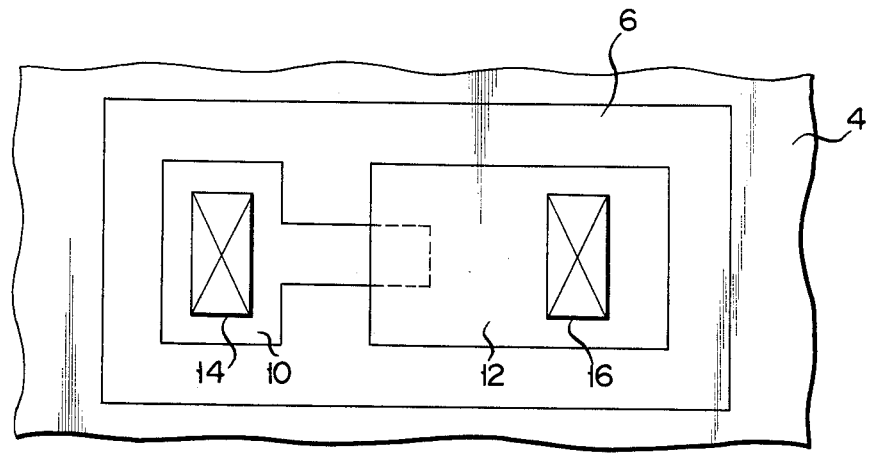
FIGS. 1A and 1B illustrate a plan pattern and a cross-sectional structure of a prior art semiconductor apparatus having a Zener diode.
Figure 1B:
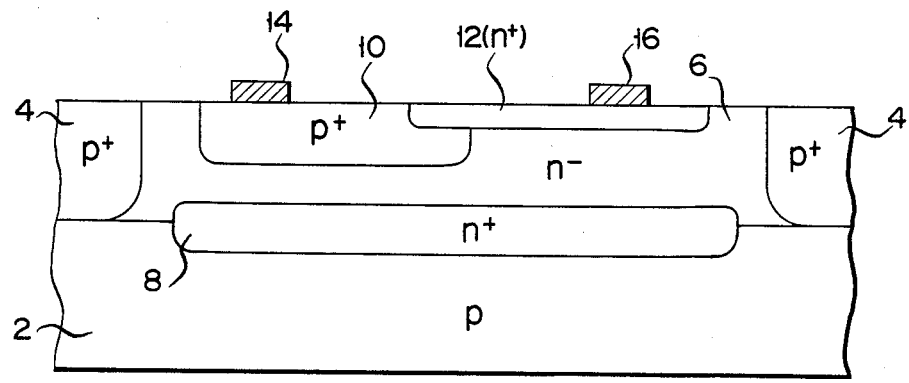
Figure 2A:
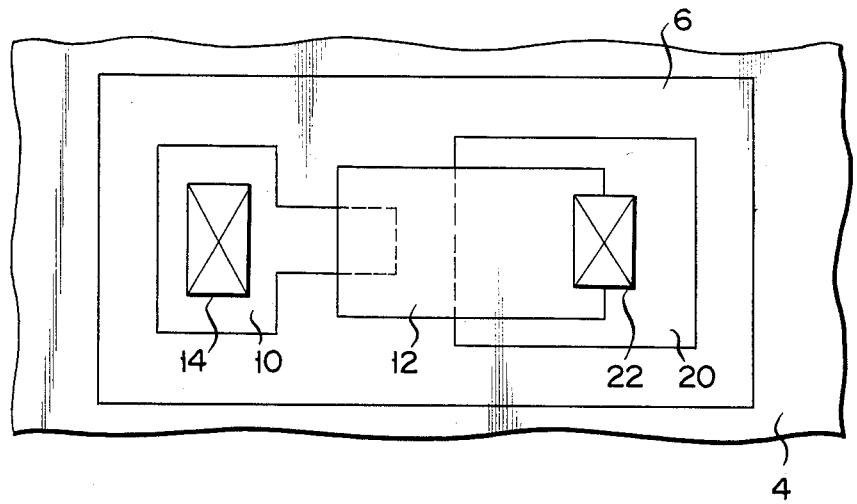
FIGS. 2A and 2B illustrate a plan pattern and a cross-sectional structure of a semiconductor apparatus having a Zener diode constructed according to one embodiment of the present invention.
Figure 2B:
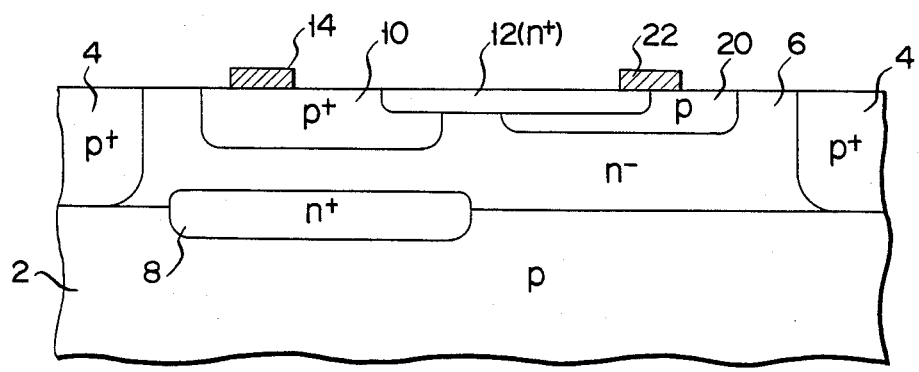
Figure 2C:
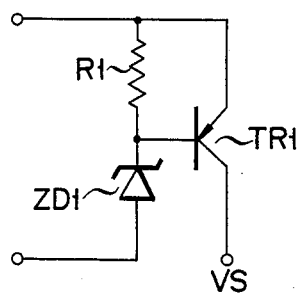
FIG. 2C is an equivalent circuit diagram of the semiconductor apparatus shown in FIGS. 2A and 2B.

FIGS. 2A and 2B illustrate an embodiment of a semiconductor apparatus having a Zener diode, according to the present invention, and FIG. 2C is an equivalent circuit diagram of the semiconductor apparatus. The semiconductor apparatus is constituted substantially in the same manner as the apparatus shown in FIGS. 1A and 1B, except that a p-type region 20 is formed in the surface area of the n⁻-type island region 6 and a cathode contact layer 22 is formed to electrically connect the p-type region 20 to an n⁺-type region 12. Specifically, in this semiconductor apparatus, the p⁺-type region 10 and p-type region 20 are formed apart from each other in the surface area of an n⁻-type island region 6, which is formed on a p-type substrate 2 and surrounded by a p⁺-type region 4, and the n⁺-type region 12 is formed in the surface areas of the p⁺- and p-type regions 10 and 20, as well as the n⁻-type island region 6. In the case of forming an npn transistor on the p-type substrate 2, the p-type region 20 can be formed when the base region of this transistor is formed.

In the semiconductor apparatus shown in FIGS. 2A and 2B, the pn junction area between the p⁺-type anode region 10 and the n⁺-type cathode region 12 forms a Zener diode ZD1, and the p-type region 20, n⁻-type region 6 and p-type substrate 2 respectively form the emitter, base and collector of a parasitic pnp transistor TR1. The n⁺-type region 12 forms a resistance component R1. That is, one end of this resistor R1 is connected to the emitter of the transistor TR1 and the cathode contact layer 22, and the other end is connected to the base of the transistor TR1 and the cathode of the Zener diode ZD1, as shown in FIG. 2C. The collector of this transistor TR1 is connected to a substrate terminal VS.

Assuming that a positive surge voltage is applied to the cathode contact layer 22, the surge current flows through the n⁺-type region 12 and p⁺-type region 10, to the anode contact layer 14. In this case, a voltage drop occurs across the resistor R1, due to this surge current, and this voltage drop is applied between the emitter and base of the transistor TR1. Therefore, when the surge current exceeds a predetermined value, the transistor TR1 is turned on and part of the surge current flows through the transistor TR1 to the substrate 2. Hence, a constant amount of surge current flows through the Zener diode ZD1 and the remaining amount of surge current flows through the transistor TR1, thereby preventing the Zener diode ZD1 from being destroyed by an excessive surge current.

FIGS. 3A and 3B illustrate a plan pattern and a cross-sectional structure of a semiconductor apparatus according to another embodiment of the present invention, and FIG. 3C shows an equivalent circuit diagram of this semiconductor apparatus. This semiconductor apparatus is constituted in substantially the same manner as the apparatus shown in FIGS. 1A and 1B, except that a p⁻-type region 30 is formed in the surface area of an n⁻-type island region 6, and an n⁺-type region 32 is formed in contact relation with the p⁺-type region 10 in the surface area of the p⁻-type region 30, and that a contact layer 34 is formed, in place of the anode contact layer 14, to electrically connect the p⁻- and n⁺-type regions 30 and 32. Specifically, in this semiconductor apparatus, a pn junction area between the p⁺-type anode region 10 and the n⁺-type cathode region 12 forms a Zener diode ZD1, and the n⁺-type region 32, p⁻-type region 30 and n⁻-type island region 6 respectively form the emitter, base and collector of a parasitic npn transistor TR2. The portion of the p⁻-type region 30 between the p⁺-type region 10 and the contact layer 34 forms a resistance component R2. Thus, as shown in FIG. 3C, one end of this resistance component R1 is connected to the base of the transistor TR2 and the anode of the Zener diode ZD1, and the other end is connected to the contact layer 34 and the emitter of the transistor TR2.

When a surge current larger than a predetermined amount flows through the Zener diode ZD1, a large voltage drop, which is great enough to turn on the transistor TR2, occurs across the resistor R2. Thus, part of the surge current flows through this conducting transistor TR2, preventing destruction of the Zener diode ZD1 by an excessive amount of surge current.

Figure 4A:
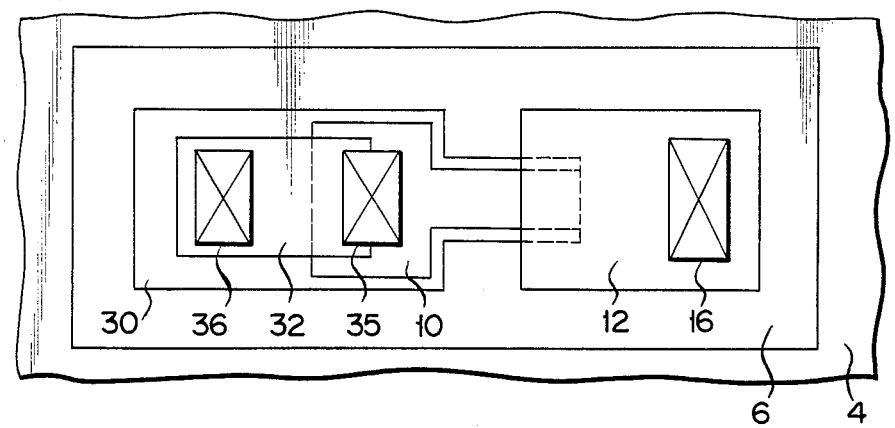
FIGS. 4A and 4B illustrate a plan pattern and a cross-sectional structure of a semiconductor apparatus having a Zener diode constructed according to yet another embodiment of this invention.
Figure 4B:
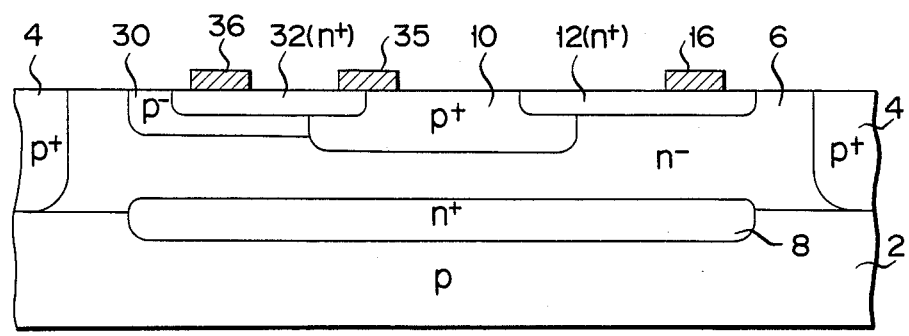
Figure 4C:
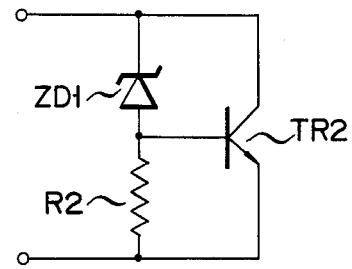
FIG. 4C is an equivalent circuit diagram of the semiconductor apparatus shown in FIGS. 4A and 4B.

FIGS. 4A and 4B illustrate the plan pattern and cross-sectional structure of a semiconductor apparatus according to yet another embodiment of this invention. Such a semiconductor apparatus is constituted substantially in the same manner as the apparatus shown in FIGS. 3A and 3B, except that the n⁺-type region 32 is formed, not only in the surface area of the p⁻-type region 30, but is formed in such a way as to enter the surface area of the p⁺-type region 10, and that in place of contact layer 34, a contact layer 35 which serves to electrically connect the p⁺-type region 10 to the n⁺-type region 32, and a contact layer 36 which is formed on the n⁺-type region 32 at a location spaced apart from this contact layer 35 are formed. Thus, even in this semiconductor apparatus, a parasitic npn transistor TR2 is formed of the n⁺-type region 32, p⁻-type region 30 and n⁻-type island region 6. The p⁻-type region 30 forming the base of this transistor TR2 is connected to the contact layer 36, through the p⁺-type region 10, contact layer 35 and n⁺-type region 32 forming the resistor. As shown in FIG. 4C, the equivalent circuit of this semiconductor apparatus is the same as that of the semiconductor apparatus shown in FIGS. 3A and 3B.

In the semiconductor apparatus shown in FIGS. 4A and 4B, when a positive surge voltage is applied to the cathode contact layer 16, a surge current flows from the cathode contact layer 16 to the anode contact layer 36, through the n⁺-type region 12, p⁺-type region 10, contact layer 35, and n⁺-type region 32. In this case, a voltage drop occurs across the resistor R2 of the n⁺-type region 32 between the contact layers 35 and 36, which causes a voltage to be developed between the base and emitter of the transistor TR2. When this voltage drop becomes larger than a predetermined value and the transistor TR2 is turned on, part of the surge current flows through the $n^+$-type region 12, $n^-$-type island region 6, $p^-$-type region 30 and $n^+$-type region 32, thereby radically suppressing the surge current flowing through the pn junction between the $n^+$-type region 12 and the $p^+$-type region 10, i.e., through the Zener diode ZD1.

Figure 5A:
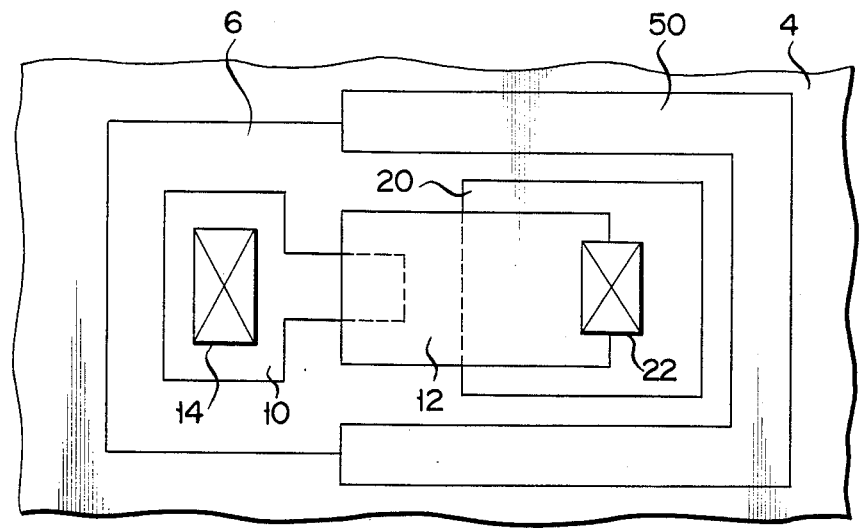
FIGS. 5A and 5B illustrate a modification of the semiconductor apparatus shown in FIGS. 2A and 2B.
Figure 5B:
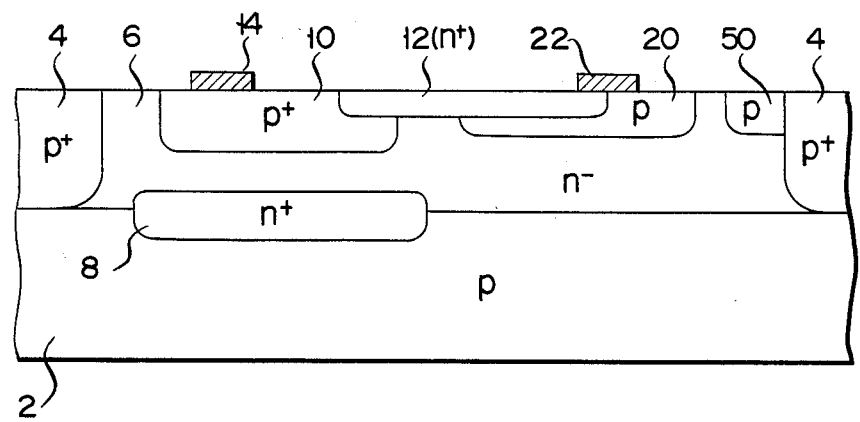

Although the present invention has been described with respect to the above embodiments, this invention is not limited only to these embodiments. For example, in the semiconductor apparatus shown in FIGS. 2A and 2B, it is possible to form a p-type region 50, as shown in FIGS. 5A and 5B, in the surface area of the $n^-$-type island region 6, which region 50 faces the p-type region 20 and enters the $p^+$-type region 4, and it is also possible to use a lateral-type pnp transistor which is formed of p-type region 20, the $n^-$-type island region 6 and p-type region 50, in place of or together with the transistor TR1.

Moreover, in the semiconductor apparatus shown in FIGS. 2A and 2B, the $n^+$-type buried layer 8 has been formed only at the location below the $p^+$-type region 10 though this layer 8 might also be formed to extend to the location below the p-type region 20. In addition, it might also be possible to form the p-type region 20 in the surface area of the $n^-$-type layer, apart from the $n^+$-type region 12, and to electrically connect the p- and $n^+$-type regions 20 and 12 via the cathode contact layer 22.

In the embodiment shown in FIGS. 3A and 3B, it is possible to form the $p^-$-type region 30 in such a way that it is separated from the $p^+$-type region 10 or it extends into the $p^+$-type region 10.

Furthermore, as may be seen from FIGS. 4A and 4B, it is possible to form the $n^+$-type region 32 in the surface area of the $p^-$-type region 30, apart from the $p^+$-type region 10, and to form the anode contact layer 35 in such a way as to electrically connect the $p^+$- and $n^+$-type regions 10 and 32.

Furthermore, in the above-described embodiments, the conductivity type of each semiconductor region may be changed.

What is claimed is:

1. A semiconductor apparatus comprising: a semiconductor substrate of one conductivity type;
    a semiconductor layer of an opposite conductivity type formed on said semiconductor substrate;
    a first and a second semiconductor region of said one conductivity type separately formed in the surface area of said semiconductor layer, apart from each other;
    a third semiconductor region of the opposite conductivity type which is formed in the surface area of said semiconductor layer and has a higher impurity concentration than said semiconductor layer, said third semiconductor region being formed in a contact relationship with respect to said first semiconductor region, a Zener diode being formed in the junction between said first and third semiconductor regions; and
    connecting means for electrically connecting said second and third semiconductor regions;
    wherein said second semiconductor region, semiconductor layer and semiconductor substrate constitute a transistor;
    and wherein that portion of said third semiconductor region which lies between said connecting means and said first semiconductor region acts as a resistor.

2. A semiconductor apparatus according to claim 1, wherein said second and third semiconductor regions are formed in contact with each other, and wherein said connecting means has a conductive layer formed on the junction area between said second and third semiconductor regions.

3. A semiconductor apparatus according to claim 2, wherein said one conductivity type is p-type and said opposite conductivity type is n-type.

4. A semiconductor apparatus according to claim 2, further comprising a buried layer of the opposite conductivity type, which is formed in the boundary area between said semiconductor substrate and said semiconductor layer, in the location corresponding to said first semiconductor region, and has a higher impurity concentration than the semiconductor layer.

5. A semiconductor apparatus according to claim 2, further comprising a fourth semiconductor region of said one conductivity type which is formed to surround said semiconductor layer and has a higher impurity concentration than said semiconductor substrate.

6. A semiconductor apparatus according to claim 5, further comprising a fifth semiconductor region of said one conductivity type which is formed in the surface area of said semiconductor layer in contact with said fourth semiconductor region and an opposing relationship with respect to said second semiconductor region.

7. A semiconductor apparatus according to claim 1, further comprising a buried layer of the opposite conductivity type which is formed in the boundary area between said semiconductor substrate and said semiconductor layer, in the location corresponding to said first semiconductor region and has a higher impurity concentration than the semiconductor layer.

8. A semiconductor apparatus according to claim 1, further comprising a fourth semiconductor region of said one conductivity type which is formed to surround said semiconductor layer and has a higher impurity concentration than said semiconductor substrate.

9. A semiconductor apparatus according to claim 8, further comprising a fifth semiconductor region of said one conductivity type formed in the surface area of said semiconductor layer in contact with said fourth semiconductor region and an opposing relationship with respect to said second semiconductor region.

* * * * *